United States Patent
Dantus et al.

(10) Patent No.: US 12,392,028 B2
(45) Date of Patent: Aug. 19, 2025

(54) LASER ACTIVATED LUMINESCENCE SYSTEM

(71) Applicant: Board of Trustees of Michigan State University, East Lansing, MI (US)

(72) Inventors: Marcos Dantus, Okemos, MI (US); Timothy A. Grotjohn, Okemos, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 279 days.

(21) Appl. No.: 17/973,610

(22) Filed: Oct. 26, 2022

(65) Prior Publication Data

US 2023/0062860 A1     Mar. 2, 2023

Related U.S. Application Data

(63) Continuation of application No. PCT/US2021/029149, filed on Apr. 26, 2021.

(Continued)

(51) Int. Cl.
  *C23C 16/27* (2006.01)
  *C01B 32/28* (2017.01)
  (Continued)

(52) U.S. Cl.
  CPC ............ *C23C 16/278* (2013.01); *C01B 32/28* (2017.08); *C23C 16/04* (2013.01); *C23C 16/274* (2013.01); *C23C 16/511* (2013.01); *C23C 16/56* (2013.01); *C30B 25/02* (2013.01); *C30B 25/04* (2013.01); *C30B 25/105* (2013.01); *C30B 25/186* (2013.01); *C30B 29/04* (2013.01); *C30B 31/06* (2013.01); *C30B 33/02* (2013.01); *C30B 33/04* (2013.01); *C30B 33/12* (2013.01); *B82Y 20/00* (2013.01); *C01P 2002/52* (2013.01)

(58) Field of Classification Search
  None
  See application file for complete search history.

(56) References Cited

U.S. PATENT DOCUMENTS 5,474,808 A    12/1995   Aslam
7,439,497 B2   10/2008   Dantus et al.
(Continued)

OTHER PUBLICATIONS

Y. Chen et al., "Laser writing of individual nitrogen-vacancy defects in diamond with near-unity yield", Optica, vol. 6, pp. 662-667. (Year: 2019).*

(Continued)

*Primary Examiner* — Jiong-Ping Lu
(74) *Attorney, Agent, or Firm* — Harness, Dickey & Pierce, PLC

(57) ABSTRACT

A laser activated luminescence system is provided. Another aspect pertains to a system employing a plasma assisted vapor deposition reactor which creates diamond layers on a substrate, in combination with a laser system to at least photoactivate and anneal the diamond layers. Yet another aspect of the present system uses a laser to assist with placement of color centers, such as nitrogen vacancy centers, in diamond. The present method uses lasers to manufacture more than two activated nitrogen vacancy center nodes in a diamond substrate, with nanometer spatial resolution and at a predetermined depth.

25 Claims, 9 Drawing Sheets

Related U.S. Application Data

(60) Provisional application No. 63/016,573, filed on Apr. 28, 2020.

(51) Int. Cl.

| | | |
|---|---|---|
| *C23C 16/04* | (2006.01) | |
| *C23C 16/511* | (2006.01) | |
| *C23C 16/56* | (2006.01) | |
| *C30B 25/02* | (2006.01) | |
| *C30B 25/04* | (2006.01) | |
| *C30B 25/10* | (2006.01) | |
| *C30B 25/18* | (2006.01) | |
| *C30B 29/04* | (2006.01) | |
| *C30B 31/06* | (2006.01) | |
| *C30B 33/02* | (2006.01) | |
| *C30B 33/04* | (2006.01) | |
| *C30B 33/12* | (2006.01) | |
| *B82Y 20/00* | (2011.01) | |

(56) References Cited

U.S. PATENT DOCUMENTS

| | | | |
|---|---|---|---|
| 7,450,618 | B2 | 11/2008 | Dantus et al. |
| 7,567,569 | B2 | 7/2009 | Dantus et al. |
| 7,583,710 | B2 | 9/2009 | Dantus et al. |
| 7,609,731 | B2 | 10/2009 | Dantus et al. |
| 7,829,724 | B2 | 11/2010 | Perrissound et al. |
| 7,973,936 | B2 | 7/2011 | Dantus |
| 9,048,632 | B1 | 6/2015 | Dantus et al. |
| 10,541,118 | B2 | 1/2020 | Grotjohn et al. |
| 2005/0095429 | A1 | 5/2005 | Reinhard et al. |
| 2006/0284118 | A1 | 12/2006 | Asmussen et al. |
| 2008/0170218 | A1 | 7/2008 | Dantus et al. |
| 2009/0188901 | A1 | 7/2009 | Dantus |
| 2009/0207869 | A1 | 8/2009 | Dantus et al. |
| 2009/0238222 | A1 | 9/2009 | Dantus et al. |
| 2009/0239078 | A1 | 9/2009 | Asmussen et al. |
| 2009/0296744 | A1 | 12/2009 | Dantus et al. |
| 2010/0034984 | A1 | 2/2010 | Asmussen et al. |
| 2010/0123075 | A1 | 5/2010 | Dantus et al. |
| 2010/0187208 | A1 | 7/2010 | Dantus et al. |
| 2011/0211600 | A1 | 9/2011 | Dantus et al. |
| 2012/0047950 | A1 | 3/2012 | Grotjohn et al. |
| 2012/0076504 | A1 | 3/2012 | Dantus et al. |
| 2012/0147911 | A1 | 6/2012 | Dantus et al. |
| 2013/0153931 | A1 | 6/2013 | Grotjohn et al. |
| 2014/0058367 | A1 | 2/2014 | Dantus |
| 2014/0220261 | A1 | 8/2014 | Asmussen et al. |
| 2015/0157209 | A1 | 6/2015 | Dantus |
| 2016/0169806 | A1 | 6/2016 | Dantus et al. |
| 2017/0271132 | A1 | 9/2017 | Grotjohn et al. |
| 2018/0219346 | A1 | 8/2018 | Dantus et al. |
| 2020/0212643 | A1 | 7/2020 | Dantus et al. |
| 2021/0214856 | A1 | 7/2021 | Grotjohn et al. |
| 2021/0239523 | A1 | 8/2021 | Dantus |
| 2021/0320183 | A1 | 10/2021 | Varghese et al. |

OTHER PUBLICATIONS

PCT Written Opinion of the International Searching Authority (Aug. 15, 2021).

Hadden, J. P., et al., "Integrated waveguides and deterministically positioned nitrogen vacancy centers in diamond created by femtosecond laser writing," Institute for Quantum Science and Technology, University of Calgary (Mar. 14, 2018).

Kononenko, V. V., et al., "Nitrogen-vacancy defects in diamond produced by femtosecond laser nanoablation technique," Applied Physica Letters 111, 081101 (2017).

Liu, Y., et al., "Fabrication of nitrogen vacancy color centers by femtosecond pulse laser illumination," Optical Society of America (2013).

Kurita, T., et al., "Efficient generation of nitrogen-vacancy center inside diamond with shortening of laser pulse duration," Applied Physics Letters 113, 211102 (2018).

Chen, Y., et al., "Laser writing of individual nitrogen-vacancy defects in diamond with near-unity yield," Optica, vol. 6, No. 5, pp. 662-666 (May 2019).

Sotillo, B., et al., "Diamond photonics platform enabled by femtosecond laser writing," Scientific Reports (Oct. 17, 2016).

Lu, Jing, "Single Crystal Microwave Plasma Assisted Chemical Vapor Diamond Synthesis at High Pressures and High Power Densities," Michigan State University Dissertation (2013).

Jeske, J., "Stimulated emission from nitrogen-vacancy centres in diamond," Nature Communications (Jan. 27, 2017).

PCT International Search Report International Application PCT/US21/29149 (Sep. 27, 2021).

\* cited by examiner

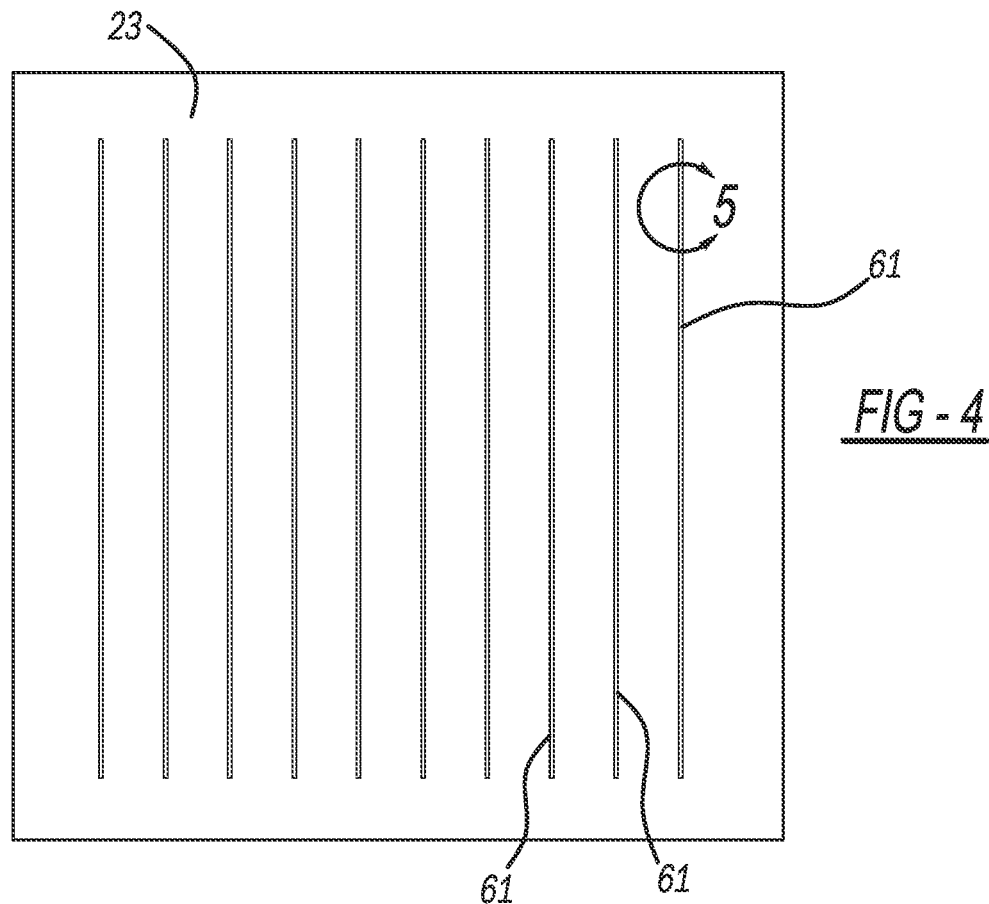
FIG-4
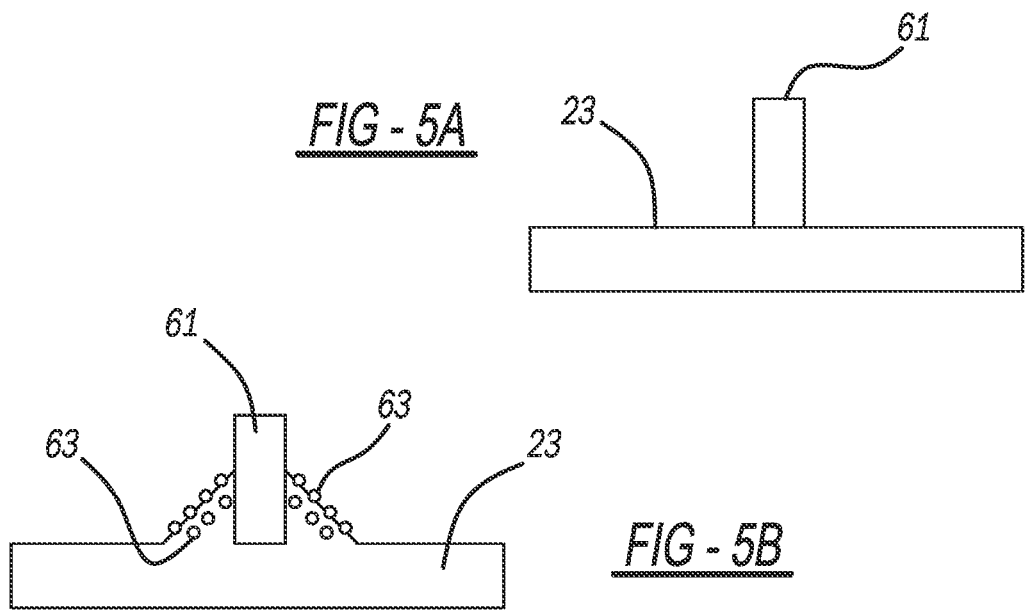
FIG-5A
FIG-5B

LASER ACTIVATED LUMINESCENCE SYSTEM

CROSS-REFERENCE TO RELATED APPLICATIONS

The present application is a continuation of PCT patent application serial no. PCT/US2021/029149 filed on Apr. 26, 2021, which claims priority to U.S. provisional patent application Ser. No. 63/016,573 filed on Apr. 28, 2020, both of which are incorporated by reference herein.

BACKGROUND

The present application relates generally to a laser activated luminescence system and more particularly to a system using a laser to assist with placement of nitrogen vacancy centers in diamond.

It is known to use a microwave cavity plasma reactor to perform microwave plasma assisted chemical vapor deposition on diamond. An exemplary conventional device is disclosed in commonly owned U.S. Pat. No. 10,541,118 entitled "Methods and Apparatus for Microwave Plasma Assisted Chemical Vapor Deposition Reactors" which issued to Grotjohn et al on Jan. 21, 2020. Furthermore, commonly owned U.S. Pat. No. 5,474,808 entitled "Method of Seeding Diamond" which issued to Aslam on Dec. 12, 1995, discloses a known method of growing and patterning diamond films on substrates. All of these patents are incorporated by reference herein.

A negatively charged nitrogen-vacancy ("NV") center in diamond is of interest for use in solid-state quantum computers. While experimental attempts have created NV center entanglement, creating a scalable network of more than two entangled nodes has proven elusive given the need for diamond purity and the ability to activate the NV centers with nanometer spatial resolution. Current state-of-the-art for NV center-based quantum information science ("QIS") research is relegated to either randomly hunting around for two NV centers that occur randomly close to each other, or implanting nitrogen ions in diamond using high resolution lithography or focused ion beams. The first approach offers no path forward to controlling the yield of entangled centers in precise locations and the second approach requires post implantation annealing, or electron irradiation and annealing. Both techniques may produce two NV centers near enough for direct quantum entanglement to occur, however, obtaining three or more NV centers has not been achieved.

Exemplary attempts to create NV centers in diamond are disclosed in the following publications: Scarabelli et al., "Nanoscale Engineering of Closely-Spaced Electronic Spins in Diamond," Nano Letters (Jul. 18, 2016) at 4982-4990; and Chen et al., "Laser Writing of Individual Nitrogen-Vacancy Defects in Diamond with Near-Unity Yield," Optica vol. 6, no. 5 (May 10, 2019) at 662. Nevertheless, inaccuracies of the ion implantation and depth uncertainty are still a concern in conventional approaches. Moreover, these traditional systems have employed randomly doped diamond substrates, which limits the benefits of the processing in terms of three-dimensional placement.

SUMMARY

In accordance with the present invention, a laser activated luminescence system is provided. Another aspect pertains to a system employing a plasma assisted vapor deposition reactor which creates diamond layers on a substrate, in combination with a laser system to at least photoactivate and anneal the diamond layers. Yet another aspect of the present system uses a laser to assist with placement of color centers, such as nitrogen vacancy centers, in diamond. A further aspect employs high-quality diamond devices for quantum computing, as well as coupling to existing qubit systems based on superconducting circuits and hybrid systems. In another aspect, the present apparatus includes a laser operable to emit a sub-50 fs pulse, a photodiode, a lens, a filter, a microscope objective and a diamond substrate. Still another aspect provides different laser pulses characteristics (such as durations or frequencies) and/or or types of lasers, for preheating, photoactivation, ionization and/or annealing of a diamond workpiece. The present method uses lasers to manufacture more than two entangled and activated NV center nodes in a diamond substrate, with nanometer spatial resolution and at a predetermined depth.

The present system and method are advantageous over prior constructions. For example, the present system and method allow for deterministically activated 3D arrays of NV centers, targeting a <30 nm center-to-center pitch in the lateral and vertical directions.

The present system and method may also create a hybrid quantum system that couples NV centers with superconducting-circuit based qubits for enhanced sensing or quantum memory applications. The combined synergies of the present femtosecond laser, high quality diamond growth and superconducting qubits is advantageous for creating durable and accurate diamond-based QIS hardware. Additional advantages and features of the present invention can be ascertained from the following description and appended claims, taken in conjunction with the accompanying drawings.

BRIEF DESCRIPTION OF THE FIGURES

FIG. 4 is a top view showing a diamond coated substrate made by the present system;

FIG. 5A is an enlarged cross-sectional view, taken within circle 5 of FIG. 4, showing the diamond substrate made by the present system;

FIG. 5B is an enlarged cross-sectional view, taken within circle 5 of FIG. 4, showing the diamond substrate made by the present system;

DETAILED DESCRIPTION

Figure 1:
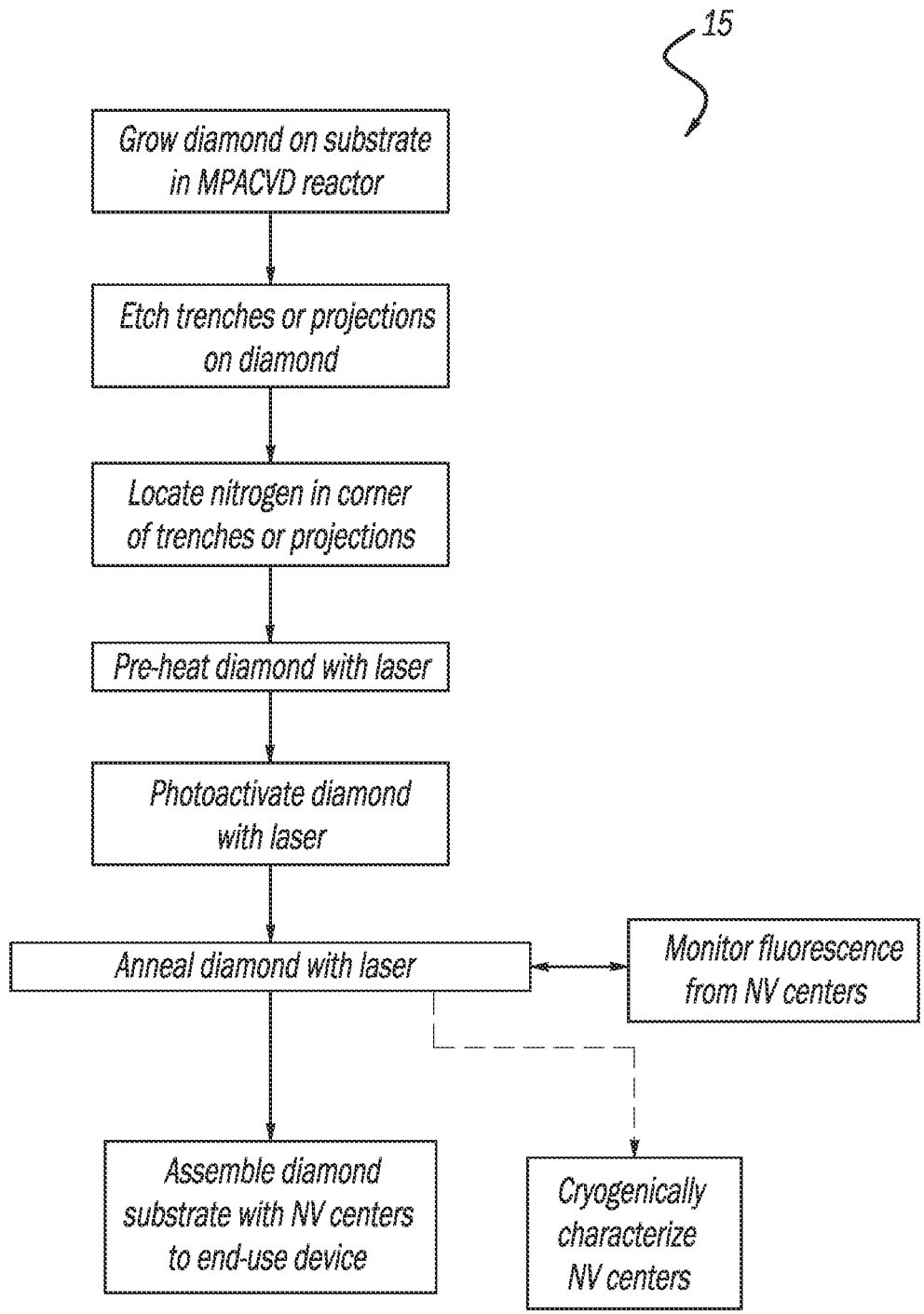
FIG. 1 is a process flow chart of the present system.
Figure 2:
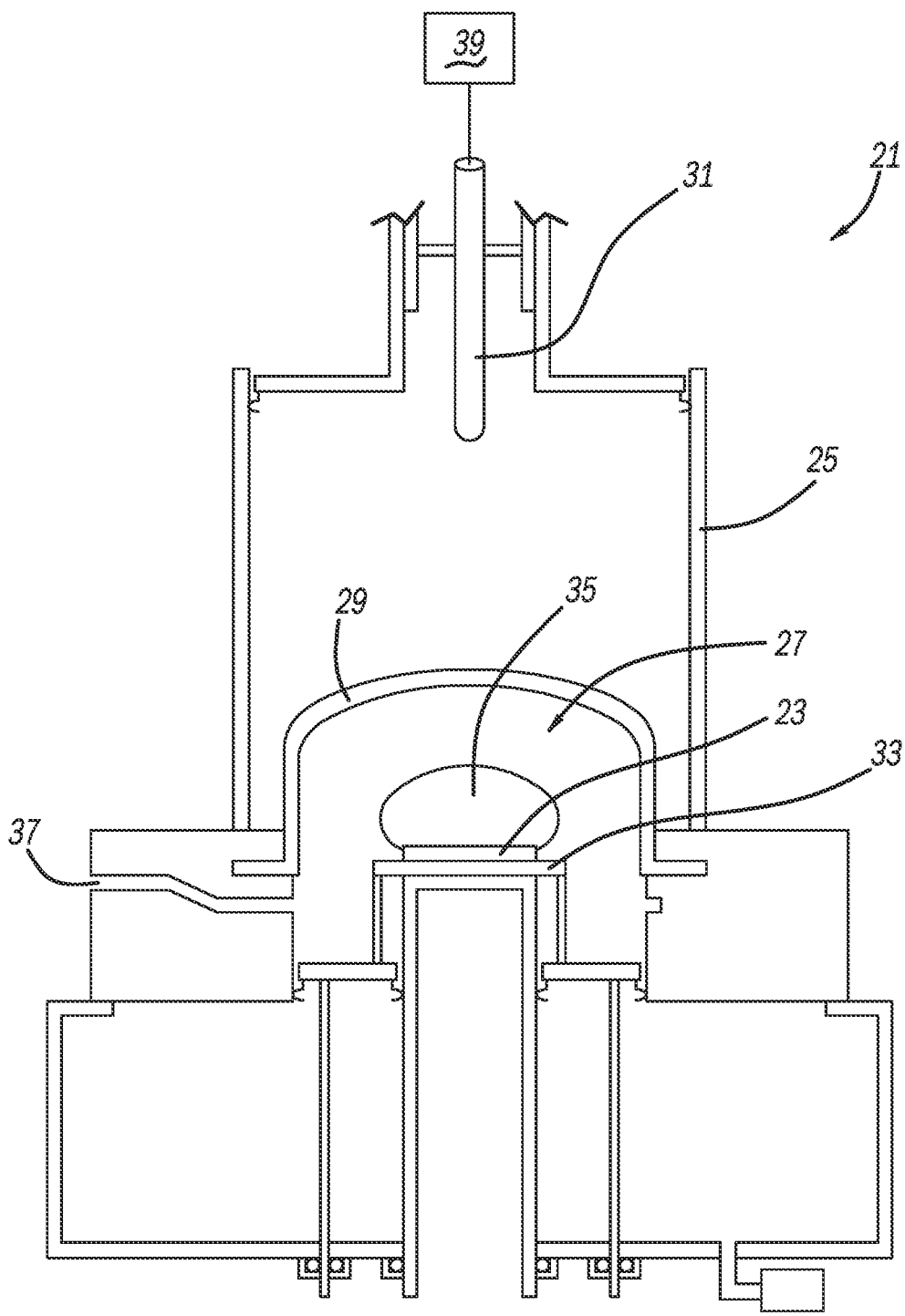
FIG. 2 is a diagrammatic cross-sectional view showing a diamond growing machine of the present system.

The present system 15 and method synergistically combine ultrafast laser technology with diamond growth technology. Referring to the workflow diagram in FIG. 1 and FIG. 3, system 101 reproducibly and reliably forms nitrogen-vacancy centers in diamond, deterministically place these centers in three dimensions, forms waveguides allowing communication between the centers and external optical interconnects, and employs the resultant workpiece in diamond qubit devices, by way of a non-limiting example. It is noteworthy that communication between NV color centers includes but is not limited to optical, entanglement and other such interactions. This integration includes one or more of the following (a)-(c), with subsequent one-time characterization and quality control of the fabricated centers by one or more of the following (d)-(g):

(a) Controlled nitrogen-doping during diamond growth such as forming three-dimensional arrays within diamond by doping thin (5-30 nm) layers with nitrogen and having the surrounding crystal without nitrogen.

(b) NV center activation by tuning laser spot size and placement to open up vacancies in the diamond within less than 100 nm-size areas and less than 100 nm-apart. Vacancies will diffuse and connect with nitrogen to form NV centers within the laser annealed spot.

(c) Using time-correlated single photon counting at two or more wavelengths to monitor the charge state of the NV centers.

(d) Using a stimulated emission depletion ("StED") laser system to characterize NV centers within 10-50 nm from each other. This will also allow for resolving and identifying NV center position and behavior, and for determining if annealed points contain entangled NV centers.

(e) A determination of NV center behavior and properties using room temperature optically detected magnetic resonance ("ODMR") to characterize lifetime, spin bath noise, and the like.

(f) Performing cryogenic characterization to determine NV properties at cryogenic temperatures.

(g) Integrating NV centers with microwave resonators and superconducting qubits, to transfer information between such devices.

System 15 includes a microwave plasma assisted chemical vapor deposition ("MPACVD") reactor 21 for synthetically growing a diamond (such as a diamond film) on an underlying substrate or workpiece 23, as an initial process. For example, a single crystal diamond substrate may be employed as substrate 23. Reactor 21 includes a microwave chamber 25 and a plasma chamber 27 within a quartz dome 29. A microwave energy excitation probe 31 is located within an upper portion of the reactor. Furthermore, a vacuum pump is coupled to the plasma chamber for creating a vacuum therein.

Diamond seeds are located on a holder 33 aligned with probe 31 along a centerline of the reactor. Feed gases such as $H_2$ and $CH_4$ flow via an inlet 37 to the plasma activation region before they are diffused through the plasma and fed toward the substrate surface. Input gases pass through and are energized in an electric discharge activation area, which creates ions and electrons. These reactive radicals contact and react with the substrate surface and cause diamond crystals or atoms to be deposited on the substrate surface. By way of a non-limiting example, pressures of approximately 60-240 Torr, and approximately 915 MHz to 2.45 GHz of energy supplied by a 1-30 kW microwave power source 39, are used.

δ-doping is accomplished by controlled layer deposition such that the dopant is added into the gas mixture in order to create less than 10 nm-thin layers of nitrogen containing diamond as the diamond is being epitaxially grown in the reactor. The number of layers, doping concentration, and interlayer spacing are controllable by regulating the flow of gases into the reactor. A single or a double layer (each having a 1-5 nm thickness at 5-20 nm spacing) of doping in the diamond substrate is employed. The nitrogen is incorporated in the diamond by selectively turning on and off the nitrogen flow and multiple layers are created with a pre-determined precise depth of nitrogen placement. In one configuration, a programmable controller automatically turns on the flow of nitrogen which one diamond layer is created, turns off the nitrogen flow for the next layer creation, back on for the third layer creation, back off for the fourth layer creation, and so on.

Doping is accurately controlled in the X-Y plane through manipulation of the growth surface, more specifically, using lithography and plasma etching to promote growth on {111} or {100} crystallographic planes through the formation of mesa-like structures 61 on diamond substrate 23 as can be observed in FIGS. 4 and 5A. Long and narrow mesa structures form the spacing between dopant atoms in the lateral direction, and with electron beam lithography can readily achieve a 10-50 nm width. Dopant nitrogen atoms 63 are placed by using a process that selectively grows diamond on the {111} surfaces that start to grow at bottom corners of mesa structures 61, as can be observed in FIGS. 5A and 5B. This procedure can be repeated to create a layered structure of dopants positioned laterally and in the z-direction. Combining this growth technique with laser annealing enables the 5-30 nm precision needed to create entangled arrays of NV centers.

Figure 6:
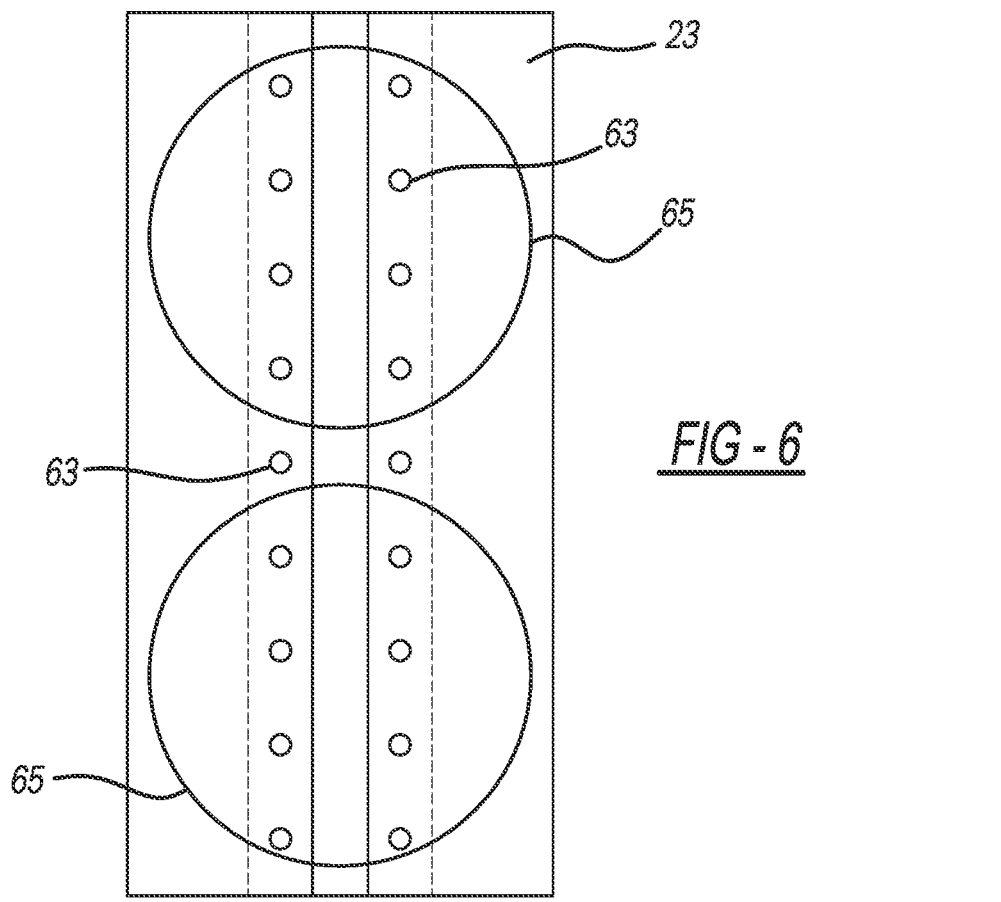
FIG. 6 is an enlarged top diagrammatic view, taken within circle 5 of FIG. 4, showing the diamond substrate made by the present system.
Figure 7:
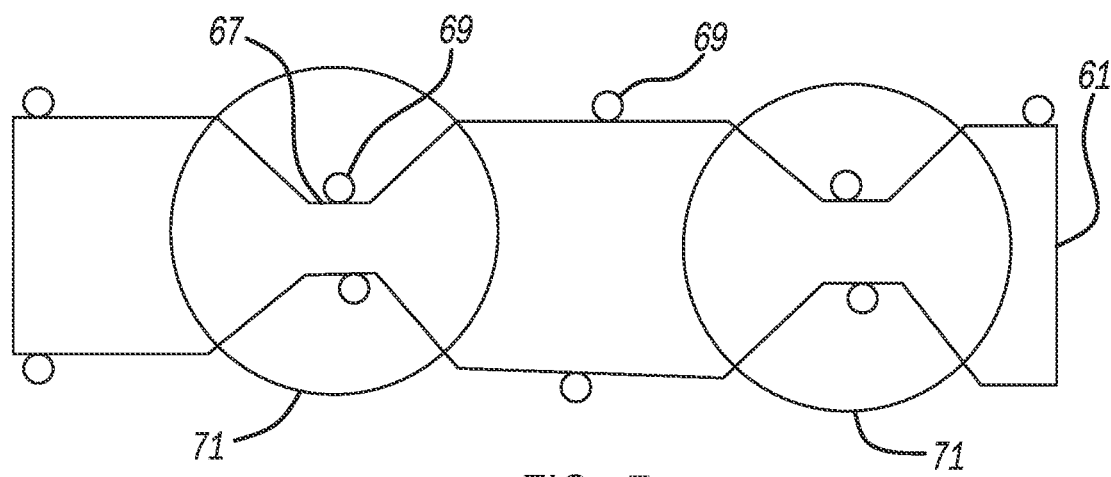
FIG. 7 is an enlarged top view, taken within circle 5 of FIG. 4, showing another embodiment of the diamond substrate made by the present system.

The control scheme for doping diamond in the lateral directions can be observed in FIGS. 5B and 6. Projecting mesa structures 61 are laid out with lithography over diamond substrate 23. The diamond is grown selectively at the edges of the mesa, promoting {111} facet growth with dopants 63. The circles referenced as 65 indicate laser annealed areas containing the dopants, as occurs in subsequent processing. FIG. 7 illustrates alternate mesa structures 67, which is a line mesa structure that has narrower grooves or recesses in some regions where nitrogen dopants 69 are more precisely placed near each other. Dopant atoms 69 as present in the mesa structures and circles 71 indicates subsequent laser annealing areas. With either mesa configuration, the nitrogen atoms are positioned adjacent corners thereof.

Figure 3:
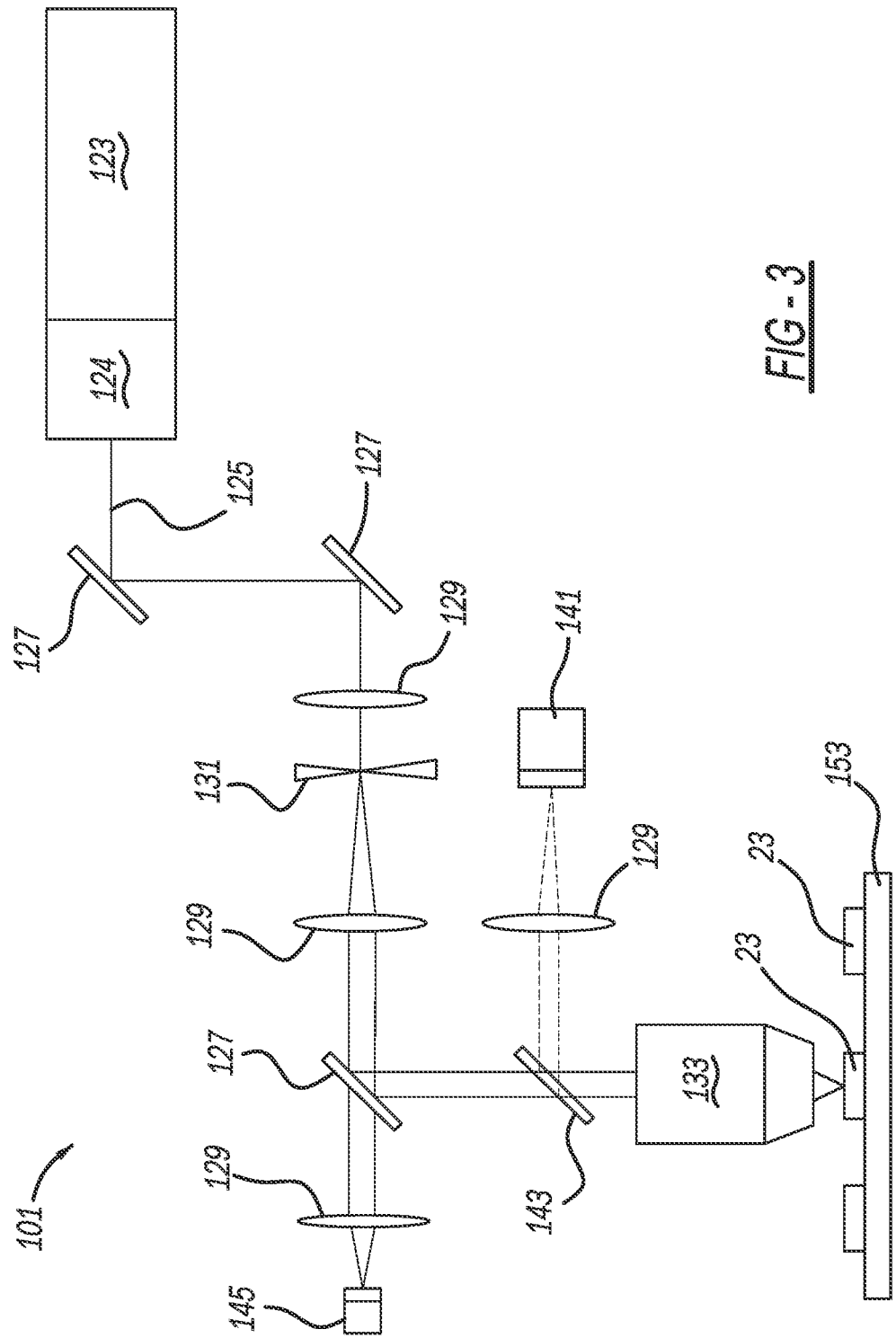
FIG. 3 is a diagrammatic view showing a laser hardware setup of the present system.

After the diamond substrate 23 is removed from the reactor, it is transferred to a laser apparatus or processing station 101. FIG. 3 illustrates an exemplary laser hardware setup for the present system. An ultrafast laser 123 is preferably a Yb laser which emits 1050 nm, sub-50 fs light pulses 125, at a repetition rate of at least 200 kHz, and an energy of approximately 30 nJ. An exemplary laser includes a pre-chirp compressor and can be obtained as the Fidelity-2 model, from Coherent, Inc. A pulse shaper for phase and amplitude modulation may also be employed. A peak power regulator and shutter 124 turn on and off the laser emission, and the regulator adjusts pulse duration and/or energy. An exemplary shutter is a diaphragm or leaf shutter with an electrical controller, which can be obtained from Thor Labs.

Optical dielectric mirrors 127, each having at least 99% reflection at 1050 nm, are used to reflect the pulses. Optical lenses 129 focus the pulses and a mode cleaning pinhole optic 131 acts as a spatial filter to clean-up a Gaussian mode of the input pulses. An exemplary pinhole optic has a diameter of 10-20 microns. Furthermore, a 80X high N.A. microscope objective 133 is employed downstream of the mirrors, lenses and pinhole optic. One such lens, pinhole optic and objective assembly, can be obtained from Newport Corp.

A silicon avalanche, single photon-counting photodiode 141 detects luminescence photons along a secondary path, split from the primary path by a dichroic mirror 143. Preferably, dichroic mirror 143 transmits laser pulse wavelengths longer than 1,000 nm while reflecting wavelengths of 550-800 nm. Moreover, a fast photodiode 145 is used for synchronization with laser 123. Photon counting photodiode 141 can be obtained from Digikey-Excelitas Technologies Corp. as model SPCM-AQRH, while fast photodiode 145 may be obtained from Thorlabs as model FDS015.

Diamond substrate workpieces 23 are located on a mechanized table or other supporting surface 153. The table surface is three-dimensionally moveable by electrically controlled piezoelectric actuators.

In one exemplary configuration, the laser beam pulse sequence is as follows. 1-10 pulses are initially emitted which each have an intensity greater than 30 nJ and a high peak intensity>$10^{12}$ W/cm$^2$. These initial pulses are then followed by at least 100,000 pulses of lower peak intensity for annealing as will be discussed in greater detail hereinafter. An acousto-optic modulator is used to achieve this level of control, and this modulator is ideally located upstream of the compressor in the laser but may alternately be downstream of the laser. Alternately, a 520 nm laser (green) is used for both preheating and annealing, working in tandem with a sub-50 fs, 1040 nm laser used for the photoactivation process.

The performance of NV centers in the diamond depends on the purity and perfect arrangement of the crystalline lattice at long (μm) and short (nm) ranges. Furthermore, the performance of devices such as quantum registers, memory elements, or magnetic sensors is directly dependent on the proximity of the vacancy to the dopant (nitrogen) and adjacent defects. Therefore, control of the placement of vacancies and dopants down to the nm-scale is greatly desirable to realizing low noise functionality of QC components, the gateway to true computing at the quantum level. The requisite control is advantageously possible in all three dimensions, the lateral directions and most significantly, the depth direction, with the present femtosecond laser pulsing which accurately creates vacancies relative to the nitrogen.

Pre-heating: Referring again to FIG. 1, after the diamond substrate is prepared in the MPACVD reactor, the preheating stage and process utilizes long laser pulses with peak intensities ranging from $10^{10}$ to $10^{12}$ W/cm$^2$ emitted from a laser. For example, a 520-540 nm continuous wave laser pulse or beam may be used. This locally preheats the diamond lattice while limiting the amount of lattice damage to avoid graphitization.

Photoactivation: After the preheating, photoactivated vacancies are created in the diamond layers by use of very short pulses emitted from the laser. Given that the ionization process involves many photons, the shorter the pulses the better, in order to displace more carbon atoms to create vacancies where they were previously located. For example, the photoactivation laser emissions may employ one or more laser pulses each having an approximately 30-50 fs duration with 1 MHz repetition rates, at a 700-1,600 nm wavelength. This allows optimization of the process in addition to intra-pulse temporal shaping, such as having a fast rise followed by a slower decay and will enable fine-tuning of the photoactivation process. Alternately, different wavelength pulses may be used in the photoactivation step to cause strong ionization, such as emitting a first pulse at 800 nm while a subsequent pulse is 1,060 nm. Photoactivation causes ionization and displacement of one or more carbon atoms, thereby leaving a vacancy. Conditions during laser photoactivation are tuned to induce photoionization without also inducing graphitization, which destroys the diamond lattice. For example, the use of short laser pulses (each pulse having a duration of approximately 20-50 fs, and more preferably 40 fs) forms vacancies while avoiding graphitization.

Laser Annealing: After the preheating and photoactivation processes, the laser annealing can be achieved through optical irradiation using the present laser apparatus with longer pulses to heat (anneal) the diamond. This laser-induced annealing heats the substrate. The goal is to increase the local temperature to achieve an annealing effect that allows the vacancies to diffuse to sites next to nitrogen. In other words, the annealing process heats up the diamond lattice enough that the vacancies move around and find a nitrogen atom, such that in the final structure, the vacancy is located next to a nitrogen atom while the nitrogen atom essentially remains unmoved. For annealing, the laser emits one longer duration pulse with an intensity from $10^8$ to $10^{10}$ W/cm$^2$ for about 1-2 seconds, and at a 250 kHz repetition rate. The pulse duration preferably has a wavelength of 400-1060 nm and more preferably about 532 nm.

Alternately, a continuous laser beam may be employed for the annealing process. In another alternate configuration, spatial interference between multiple pulses may create narrow, localized or different surface discontinuity features (such as a projection or trench) during photoactivation, and therefore NV locations. In a further optional process, polarization of the laser pulses may be controlled to align or change spins of the NV centers.

The photoactivation step is a nonlinear or multi-photonic process which may require a more complex fs laser. The annealing step is a linear photonic process, which allows for use of a less complex laser such as a diode laser. But the same, more complex laser can be used for both the annealing and photoactivation steps. Moreover, the laser processes are in a clean room containing ambient air and do not need to be in a vacuum chamber.

Monitoring: Monitoring of the visible fluorescence emitted from the NV centers may be used to determine when the annealing process has been completed. This can be automated with a programmable controller and a closed loop, real-time feedback loop electrical circuit, or may be manually controlled. Referring to FIG. 3, fluorescence photons, detected by photon counting photodiode 141 with an interchangeable filter, are used to determine the NV center spin states, which is needed for the qualification of the growth and annealing processes to create the 'right' NV centers (NV$^-$ centers, instead of NV$^0$). A ratio between emitted photons at 700-800 nm and 550-625 nm is directly proportional to a ratio of the desired NV$^-$ centers to NV$^0$ centers. In other words, the annealed diamond substrate is irradiated with the laser and fluorescence is monitored until the spectrum changes according to the desired NV state, as illustrated in FIG. 1. These wavelength regions are selected using bandpass filters, such as those sold by Chroma or Thorlabs.

Figure 12:
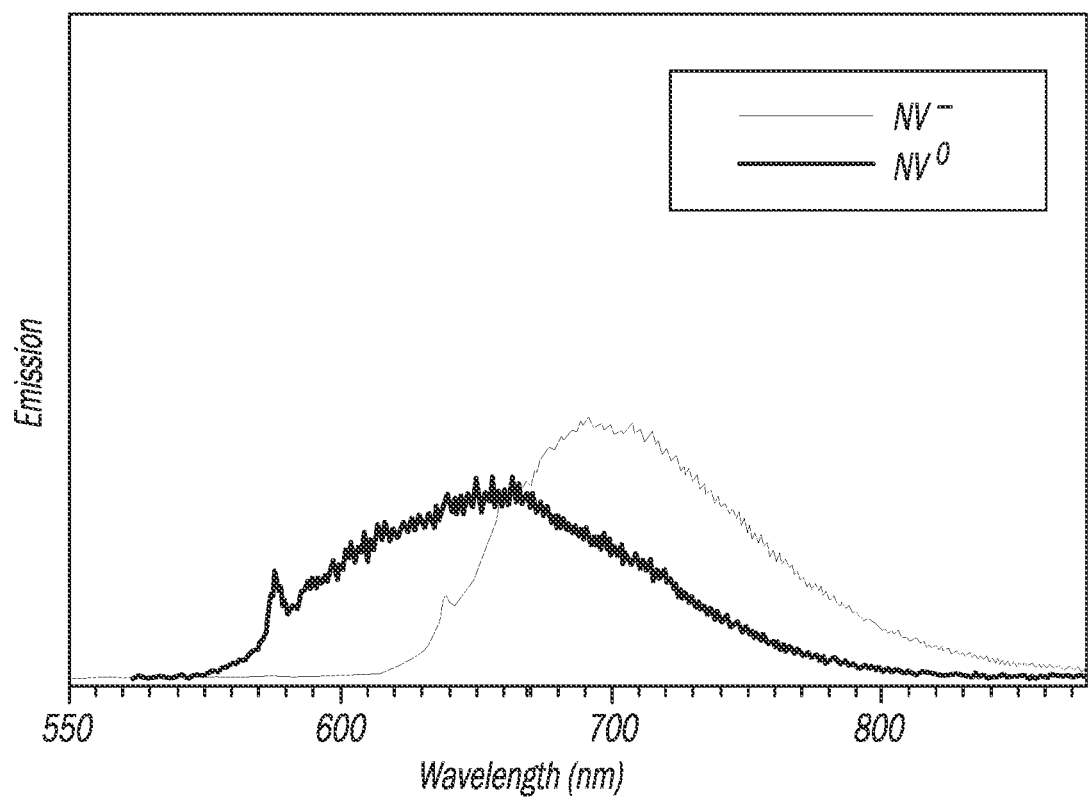
FIG. 12 is a graph showing a spectrum expected from NV centers illustrating the relationship of intensity versus wavelength and a signature of NV centers, for the present system.

More specifically, FIG. 12 illustrates a spectra expected to be acquired from the present NV centers showing the relationship of intensity versus wavelength. This shows a clear signature of $NV^-$ in the present NV centers. Exemplary spectra for $NV^-$ emission and $NV^0$ emission are obtained after laser excitation, and the ratio between $NV^-$ and $NV^0$ emissions can be determined when luminescence is detected in a pulsed excitation region, such as a region centered at or near 700 nm.

Figure 8:
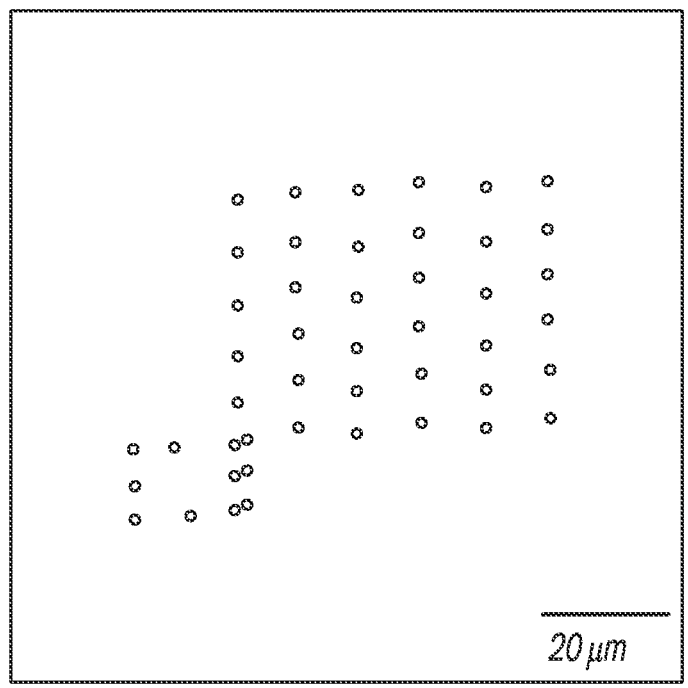
FIG. 8 is a top elevational view showing an array of concentration dots on the diamond substrate made by the present system.
Figure 9:
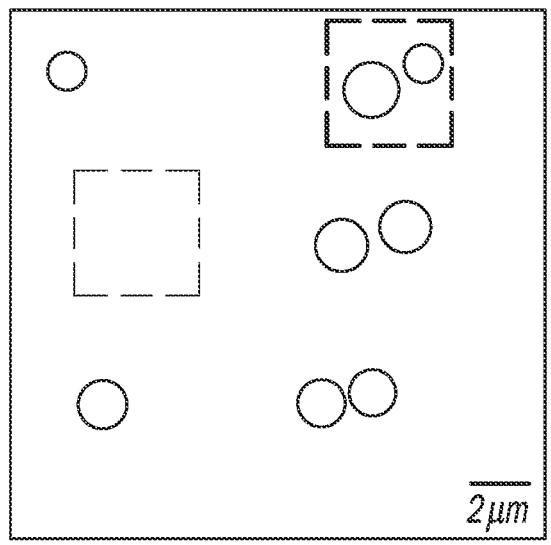
FIG. 9 is a high magnification top view image showing the diamond substrate made by the present system.

FIGS. 8 and 9 show a diamond sample expected to be grown with nitrogen doping and then processed to create the vacancies and achieve annealing with the femtosecond laser of the present system. The expected diamond sample can be grown using the conditions listed in the following Table 1. A high nitrogen concentration in the growth atmosphere may be used to increase the likelihood of NV center activation by laser annealing, which also can lead to coloration of the diamond based on the nitrogen doping concentration. Laser activation and annealing uses exemplary 30 nJ pulses at 200 kHz frequencies, 45 fs/pulse, for 1 second per spot in the array as can be seen in FIGS. 8 and 9. Pulse duration and irradiation time vary by approximately ±10% per spot.

TABLE 1

Deposition parameters used to grow nitrogen-doped diamond.

| Parameters | Temperature (° C.) | Pressure (Torr) | Methane (%) | Nitrogen (ppm) | Time (hr) | Growth Rate (μm/hr) |
|---|---|---|---|---|---|---|
| Settings | 970 | 210 | 5 | 100 | 10 | 30 |

Figure 13:
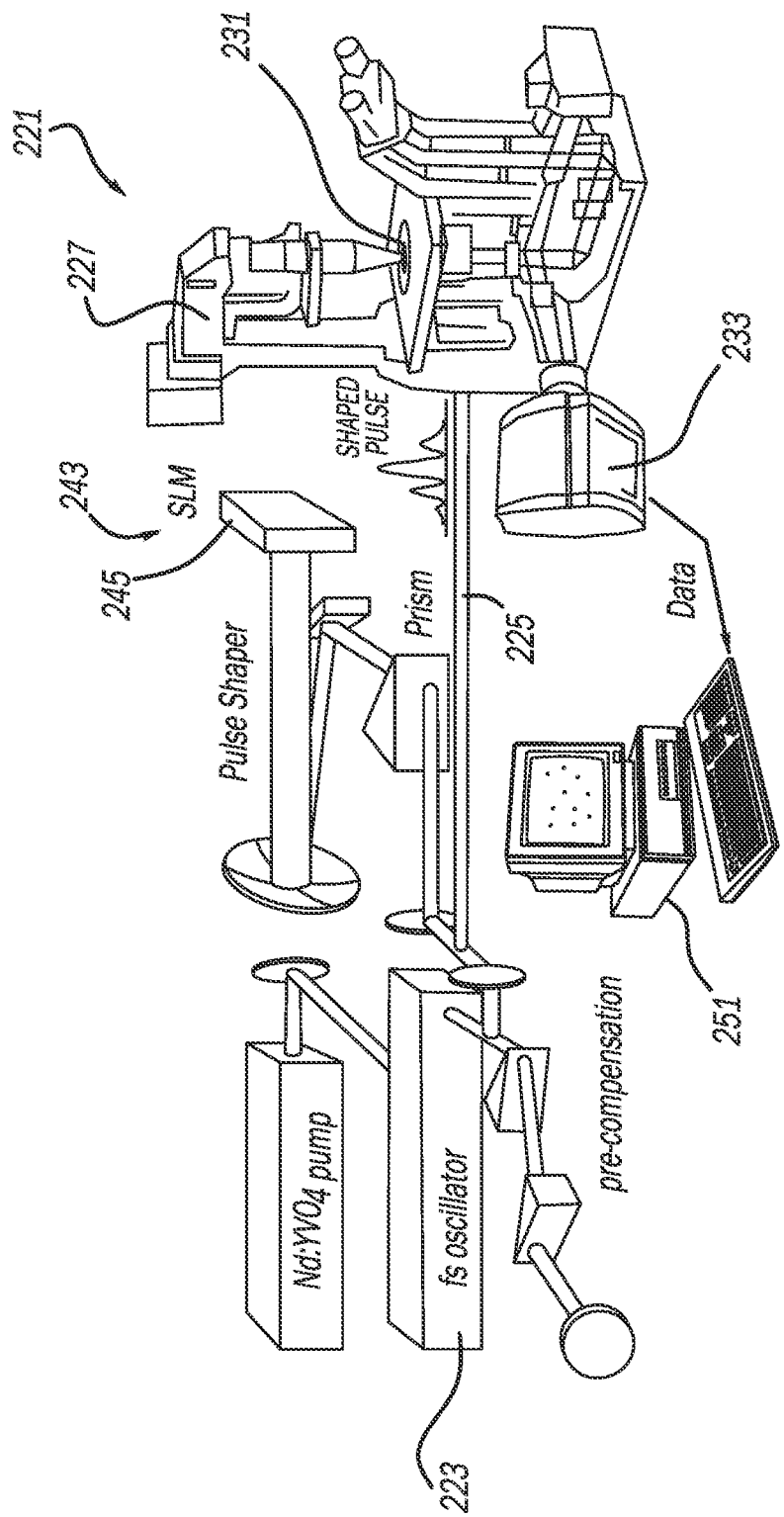
FIG. 13 is a diagrammatic view showing a laser pulse sequence used with the diamond substrate made by the present system.

An alternate laser system 221 configuration is shown in FIG. 13. This diamond NV center fabrication laser setup includes an $ND:YVO_4$ pump laser and fs oscillator 223, from which is emitted a series of fs laser pulses 225. Further included is an SLM pulse shaper 245 as part of a MIIPS® control system 243, a set of optics such as mirrors, prisms and lenses, and a microscope 227 where waveguides and color centers are inscribed on a workpiece substrate 231 via computer-controlled x-y positioning and changes in the properties of the laser pulses. The process is monitored by a camera 233 which is coupled to send data signals to a programmable computer controller 251. Characterization of the annealed array uses a Nikon A1 confocal type of microscope 227. Measurement parameters are chosen to produce fluorescence from the NV centers at characteristic wavelengths of 575 nm for $NV^0$ centers and 637 nm for $NV^-$ centers. The arrays, shown in FIG. 8, are located at the approximate center of the diamond. A high magnification image of part of the array, shown in FIG. 9, is located at the approximate center of the diamond. Doping the diamond lattice with phosphorous is expected to enable control of the conversion efficiency of laser annealing to yield greater percentages of $NV^-$ to $NV^0$.

It is noteworthy in the preceding examples that the creation of three-dimensional structures serves to control the position of two or more color centers, which includes one or more of nitrogen-vacancies, silicon-vacancies, germanium-vacancies or other atomic-vacancies. These three-dimensional structures are made by etching. Furthermore, the present system creates multiple delta-layers of diamond, which may be sub-100 nm in thickness, and more preferably less than 10 nm and even more preferably less than 5 nm.

Uses: The present laser system is adapted to operably create luminescence centers in the workpiece that have robust optical and magnetic properties. Furthermore, the present laser system is adapted to operably generate optical guides in the workpiece. This is ideally suited for optimizing the generation of both luminescent centers and optical waveguides as part of optical circuits on transparent substrates, such as diamond. For example, these optical waveguides may connect NV color centers in a sophisticated photonic system created in diamond or another transparent substrate including but not be limited to calcium/magnesium fluoride, silicon carbide, silica, or sapphire. The predetermined, accurate, three dimensional positioning (especially in the depth or z-direction) of the dopant is achieved by controlling the flow of gases into the diamond growth process, followed by the use a femtosecond laser to pre-heat, photoactivate and anneal the diamond, using laser pulses with at least one different characteristic (e.g., duration, energy, peak intensity, repetition, quantity, etc.) to create NV centers.

Figure 10:
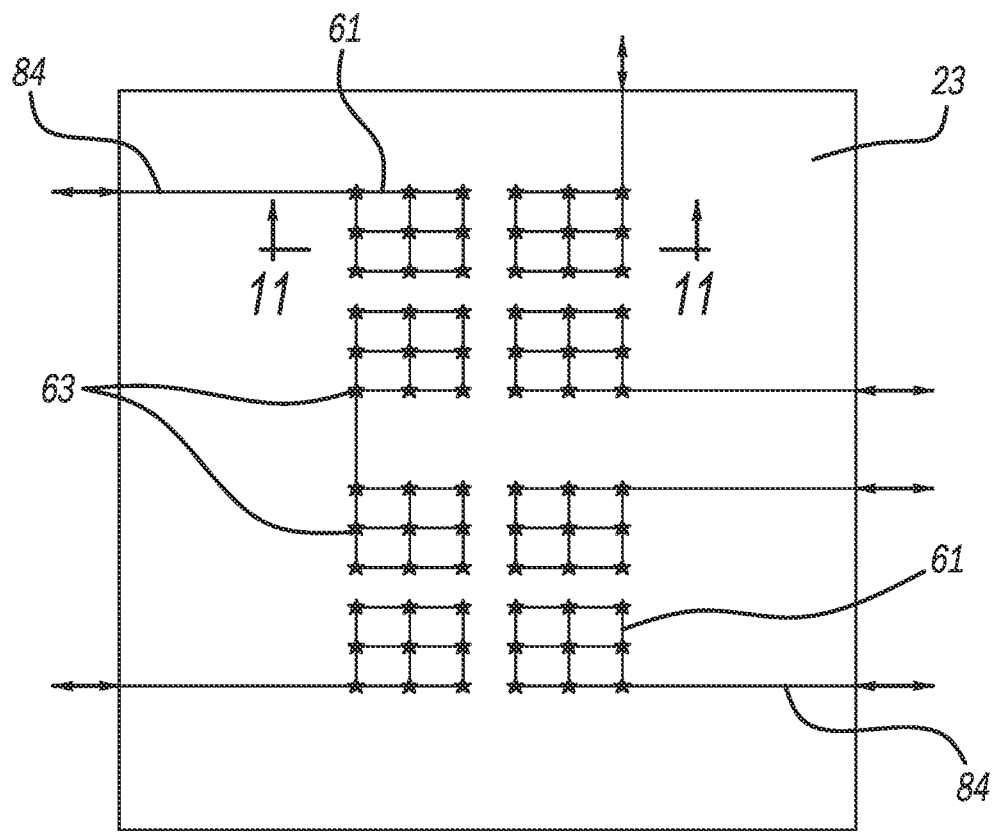
FIG. 10 is a top diagrammatic view showing optical waveguides on the diamond substrate of the present system.
Figure 11:
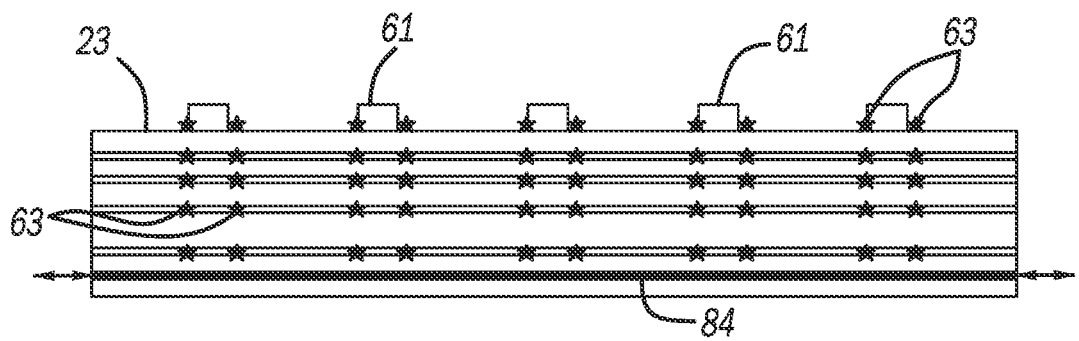
FIG. 11 is a side diagrammatic view showing the optical waveguides on the diamond substrate of the present system.

Referring to FIGS. 10 and 11, optical waveguides 84 are created by the fabrication femtosecond laser 123 (see FIG. 3) or 223 (see FIG. 13) in diamond substrate 23. A top layer of substrate 23 has etched trenches between projecting formations or surface discontinuities 61 with the individual NV centers located at corners thereof. The deeper underlying layers of substrate 23, which have also been doped with Nitrogen or other atoms at specific pre-determined depths (which may or may not be equal depths), are activated to create stacked columns of individual NV centers close enough to communicate with nearby NV centers. The activation is achieved from the top down or the bottom up. One or more waveguides 84 are created between layers (shown here between the bottom two layers). The femtosecond laser can create the waveguide by altering an index of refraction without ablation, such that the laser causes the change in refractive index only at a depth where the laser is focused; this provides three dimensional control with about 50-100 nm accuracy. The area with a higher or lower index acts as the waveguide. In an exemplary aspect of the present system and method, the same single femtosecond laser may be used to create both the NV centers and the buried waveguides. Optical fibers are coupled to ports (denoted by double arrows) in the side edges of the substrate to allow laser light entry and exit from waveguides 84. Best transmission will be achieved by matching the refraction index between the diamond substrate to the glass material in the optical fiber. These waveguides create networks of optically interconnected NV centers 63 between different depth layers of substrate 23.

Diamond, especially diamond engineered to have specific properties for various quantum applications, has significant potential to drive advances in sensor, communication and quantum computing applications. NV centers (and optionally other color centers in diamond) as sensors are ideally suited to achieve high spatial resolution in NMR and MRI measurements, accurate non-GPS based navigation hardware, as well as quantum sensors in biology, neurology and medicine. Diamond-based quantum magnetometers will also be applied as part of highly precise and reliable magnetic position sensors, and in room temperature magnetic encephalogram scanning devices small enough to fit into wearable helmets, among others. Diamond color center based quantum communication connections and networks will provide ever more secure communications in the highly vulnerable areas of scientific and industrial data flow, financial/banking, homeland security, and defense. The future realization of universal quantum computers incorporating the diamond substrates of the present system are ideal for quantum computer-based simulations will enable major advances in the study of systems that are quantum in nature such as the behavior of large molecules including, for example, protein folding, which has use in accelerating pharmaceutical advances. The potential for quantum computing using the present substrates is also immense in other areas including complex path planning for transportation/ logistics systems, cybersecurity and cryptography, forecasting, big data and artificial intelligence.

More specifically, NV centers in diamond can be used as very sensitive magnetometers based on the relative shift of energy levels by a magnetic field that can be detected with high sensitivity, which enables determination of scalar and/ or vector DC and AC magnetic fields. The sensitivity is determined by the spin coherence and spin projection noise. Furthermore, the application of quantum control techniques allows highly sensitive measurements of external magnetic fields from the present diamond coated substrates. NV centers, which behave as isolated electrons with a spin state that can be addressed both optically and electromagnetically, have been considered ideal registers in a qubit or sensing network due to their long spin state coherence lifetime (up to milliseconds) at room temperature and longer at lower temperatures.

When used for quantum computers, quantum memories and other quantum applications, the present diamond based qubit systems avoid the complexities associated with the extremely low temperature requirements of conventional superconducting systems. The potential synergistic advantages for diamond NV centers include:

Higher scalability with 2D mapping of qubits that could extend to >1,000's of qubits for full implementation of quantum computing;

Arbitrary selection of qubits for interaction using photonic channels with laser addressing;

Nearby nuclear spins to the NV centers in the diamond that have long coherence times (>60 seconds) allowing their use in error correction and quantum memory; and Operation at (T>10K) environments that require less complex cooling as compared to superconducting qubits that require dilution refrigeration for T<<1K.

It is alternately envisioned that each layer of the diamond may contain different dopants and/or different dopant concentrations during diamond growth. This layer-by-layer difference achieves a wide variety of color center performance that may be used for storing and manipulating quantum information.

While various embodiments of the present invention have been disclosed, it should also be appreciated that other variations may be employed. For example, additional or alternate optics may be included in the present laser setup, however, many of the performance advantages may not be achieved. It is alternately envisioned that alternate diamond growth reactor machinery may be utilized, although some of the preferred advantages may not be realized. Furthermore, additional or fewer processing steps can be used, although some benefits may not be obtained. It should also be appreciated that any of the preceding embodiments and features thereof can be mixed and matched with any of the others in any combination depending upon the final product and processing characteristics desired. Variations are not to be regarded as a departure from the present disclosure, and all such modifications are intended to be included within the scope and spirit of the present invention.

The invention claimed is:

1. A method of manufacturing a diamond, the method comprising:
(a) epitaxially growing the diamond within a plasma assisted chemical vapor deposition reactor;
(b) etching the diamond to create a surface discontinuity located inwardly from a periphery of the diamond;
(c) forming color centers in the diamond in predetermined three-dimensional locations;
(d) emitting multiple ionization laser pulses, of different characteristics, to ionize the diamond;
(e) emitting at least one annealing laser pulse to anneal the diamond; and
(f) the locations of the color centers allowing communication between more than two of the color centers.

2. The method of claim 1, further comprising:
doping the diamond with non-carbon atoms in at least one layer having a thickness less than 100 nm.

3. The method of claim 1, further comprising:
pre-heating the diamond with at least one pre-heating laser pulse while limiting an amount of lattice damage therein to avoid graphitization, the pre-heating step occurring before the ionization emission step and the annealing emission step;
the different characteristic of the ionization laser pulses including different frequencies, and the ionizing laser pulses creating the color centers adjacent a corner of the surface discontinuity; and
the emitting of the at least one second laser pulse to anneal the diamond comprising emitting multiples of the annealing laser pulse to optimize characteristics of the color centers.

4. The method of claim 1, further comprising:
pre-heating the diamond with at least one laser beam;
the at least one pre-heating laser beam having a peak intensity from $10^{10}$ to $10^{12}$ W/cm$^2$, and a 520 to 540 nm wavelength;
the ionization pulses each having a 30 to 50 fs duration with 1 MHz repetition rates, and a 700-1,600 nm wavelength;
the at least one annealing pulse having a pulse intensity from $10^8$ to $10^{10}$ W/cm$^2$ for about 1 to 2 seconds, a 250 kHz repetition rate, and a 400 to 1,060 nm wavelength; and
monitoring fluorescence of the color centers with the same laser as emits the at least one annealing pulse.

5. The method of claim 1, further comprising:
activating the color centers, which are nitrogen-vacancy centers, by tuning laser spot size and placement to open up the vacancies in the diamond within less than 100 nm-size areas and less than 100 nm-apart; and
causing the vacancies to diffuse and connect with nitrogen to form the nitrogen-vacancy centers within the laser annealed spots.

6. The method of claim 1, further comprising using time-correlated single photon counting at two or more wavelengths to monitor a charge state of the color centers.

7. The method of claim 1, further comprising using a stimulated emission depletion laser to characterize the color centers within 10-50 nm from each other to identify position and behavior of the color centers, and to determine if annealed points contain entangled color centers.

8. The method of claim 1, further comprising:
integrating the color centers, which are nitrogen-vacancy centers, with: (a) microwave resonators or (b) superconducting qubits, to transfer information therebetween; and
the annealing increasing a local temperature of the diamond to allow vacancies to diffuse to sites next to nitrogen atoms.

9. A method of manufacturing a synthetic diamond, the method comprising:
(a) creating the synthetic diamond within a plasma assisted chemical vapor deposition reactor, with the diamond including a surface discontinuity located inwardly from a periphery of the diamond, the diamond being doped by non-carbon atoms in at least one layer having a thickness less than 100 nm;
(b) emitting at least one first laser pulse to photoactivate the diamond to create first nitrogen-vacancies adjacent a corner of the surface discontinuity;
(c) emitting at least one second laser pulse to anneal the diamond to optimize characteristics of the first nitrogen-vacancies or a first color center, the first and second laser pulses having at least one different characteristic; and
(d) creating a second nitrogen-vacancy or a second color center, in the diamond at a pre-determined depth.

10. The method of claim 9, further comprising:
pre-heating the diamond with at least one pre-heating laser beam while limiting an amount of lattice damage therein to avoid graphitization, the pre-heating step occurring between the creating step and the photoactivation emission step; and
the at least one pre-heating laser beam having a peak intensity from $10^{10}$ to $10^{12}$ W/cm$^2$, and a 520 to 540 nm wavelength.

11. The method of claim 10, wherein the at least one photoactivation pulse includes multiple photoactivation laser pulses each having a 30 to 50 fs duration with 1 MHz repetition rates, and a 700-1,600 nm wavelength.

12. The method of claim 10, wherein the at least one annealing pulse includes a pulse with an intensity from $10^8$ to $10^{10}$ W/cm$^2$ for about 1 to 2 seconds, a 250 kHz repetition rate, and a 400 to 1,060 nm wavelength.

13. The method of claim 9, further comprising controlling the doping during diamond growth while forming three-dimensional arrays within the diamond by the doping being on multiple of the at least one layer, each having a thickness of 5-30 nm, with nitrogen and causing a surrounding crystal to be without nitrogen.

14. The method of claim 9, further comprising:
activating nitrogen-vacancy centers by tuning laser spot size and placement to open up the vacancies in the diamond within less than 100 nm-size areas and less than 100 nm-apart;
causing the vacancies to diffuse and connect with nitrogen to form the nitrogen-vacancy centers within the laser annealed spots; and
monitoring fluorescence of the nitrogen-vacancy centers with the same laser which emits the at least one second annealing laser pulse.

15. The method of claim 9, further comprising using time-correlated single photon counting at two or more wavelengths to monitor a charge state of the nitrogen-vacancy centers.

16. The method of claim 9, further comprising using a stimulated emission depletion laser to characterize the nitrogen-vacancy centers within 10-50 nm from each other to identify position and behavior of the nitrogen-vacancy centers, and to determine if annealed points contain entanglement of the nitrogen-vacancy centers.

17. The method of claim 9, further comprising integrating the nitrogen-vacancy centers with: (a) microwave resonators or (b) superconducting qubits, to transfer information therebetween.

18. The method of claim 9, further comprising:
varying polarization of the laser pulses to align or change spins of the nitrogen-vacancy centers; and
creating multiples of the surface discontinuity on the diamond, at least a majority of which are longitudinally elongated, substantially parallel and laterally spaced apart, by etching in the reactor.

19. The method of claim 9, further comprising using spatial interference between multiple of the laser pulses to create narrow, localized or different surface discontinuity features during the photoactivation step.

20. The method of claim 9, further comprising:
creating the second nitrogen-vacancy or the second color center, in the diamond at a pre-determined lateral spacing from the first nitrogen-vacancy or the first color center; and
creating at least a third nitrogen-vacancy or a third color center, in the diamond at a pre-determined lateral spacing from: the first and the second nitrogen-vacancies, or the first and the second color centers.

21. A method of manufacturing a diamond, the method comprising:
(a) pre-heating the diamond with at least one laser beam;
(b) forming color centers in the diamond in predetermined three-dimensional locations;
(c) emitting multiple ionization laser pulses, of different characteristics, to ionize the diamond;
(d) emitting at least one annealing laser pulse to anneal the diamond; and
(e) the locations of the color centers allowing communication between more than two of the color centers.

22. The method of claim 21, further comprising:
performing the pre-heating of the diamond with the at least one pre-heating laser beam while limiting an amount of lattice damage therein to avoid graphitization, the pre-heating step occurring before the ionization emission step and the annealing emission step;
the different characteristic of the ionization laser pulses including different frequencies, and the ionizing laser pulses creating the color centers adjacent a corner of a surface discontinuity; and
the emitting of the at least one second laser pulse to anneal the diamond comprising emitting multiples of the annealing laser pulse to optimize characteristics of the color centers.

23. The method of claim 21, further comprising:
the at least one pre-heating laser beam having a peak intensity from $10^{10}$ to $10^{12}$ W/cm$^2$, and a 520 to 540 nm wavelength;
the ionization pulses each having a 30 to 50 fs duration with 1 MHz repetition rates, and a 700-1,600 nm wavelength;

the at least one annealing pulse having a pulse intensity from $10^8$ to $10^{10}$ W/cm$^2$ for about 1 to 2 seconds, a 250 KHz repetition rate, and a 400 to 1,060 nm wavelength; and monitoring fluorescence of the color centers with the same laser as emits the at least one annealing pulse.

24. The method of claim 21, further comprising:

varying polarization of the laser beam, which include laser pulses, to align or change spins of the color centers, which include nitrogen-vacancy centers; and creating multiple surface discontinuities on a substrate, at least a majority of which are longitudinally elongated, substantially parallel and laterally spaced apart, by etching in a plasma assisted chemical vapor deposition reactor.

25. The method of claim 21, further comprising using spatial interference between multiple laser pulses of the laser beam to create narrow, localized or different surface discontinuity features during photoactivation.

* * * * *